(12) United States Patent
Seshadri et al.

(10) Patent No.: US 10,699,912 B2
(45) Date of Patent: Jun. 30, 2020

(54) DAMAGE FREE HARDMASK STRIP

(71) Applicant: INTERNATIONAL BUSINESS MACHINES CORPORATION, Armonk, NY (US)

(72) Inventors: Indira Seshadri, Niskayuna, NY (US); Ekmini A. De Silva, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/158,981

(22) Filed: Oct. 12, 2018

(65) Prior Publication Data
US 2020/0118831 A1    Apr. 16, 2020

(51) Int. Cl.
*H01L 21/311* (2006.01)
*H01L 21/033* (2006.01)

(52) U.S. Cl.
CPC .... *H01L 21/31144* (2013.01); *H01L 21/0332* (2013.01); *H01L 21/31111* (2013.01)

(58) Field of Classification Search
CPC ................................................. H01L 21/31144
See application file for complete search history.

(56) References Cited

U.S. PATENT DOCUMENTS

| | | | |
|---|---|---|---|
| 6,448,176 B1 | 9/2002 | Grill et al. | |
| 7,037,851 B2 | 5/2006 | Gueneau de Mussy et al. | |
| 7,226,853 B2 | 6/2007 | Bekiaris et al. | |
| 7,494,886 B2 | 2/2009 | Ren et al. | |
| 8,048,811 B2 | 11/2011 | Feustel et al. | |
| 8,441,050 B2 | 5/2013 | Luo et al. | |
| 2007/0015372 A1* | 1/2007 | Yoon | C09K 13/04 438/745 |
| 2007/0059913 A1 | 3/2007 | King et al. | |
| 2008/0248626 A1* | 10/2008 | Liu | H01L 21/76224 438/424 |
| 2010/0330756 A1 | 12/2010 | Basker et al. | |
| 2018/0005814 A1 | 1/2018 | Kumar et al. | |
| 2018/0166469 A1 | 6/2018 | Zhang | |

OTHER PUBLICATIONS

Lai, "Hard Mask and Lithographic Capabilities Improvement by Amorphous Carbon Step Coverage Optimization in High Aspect Ratio Device Pattern", Vacuum, vol. 153, Jul. 2018, pp. 267-273.

* cited by examiner

*Primary Examiner* — Roberts P Culbert
(74) *Attorney, Agent, or Firm* — Tutunjian & Bitetto, P.C.; Vazken Alexanian

(57) ABSTRACT

A computer program product and methods are provided for semiconductor processing. The method includes forming a masking layer on a first region. The method also includes implanting a second region. The method further includes depositing a protective layer over the first region and the second region, with the protective layer being selectively etchable to the masking layer and thicker over the second region. The additional includes removing the protective layer from the first region. The method also includes etching the masking layer exposing a bottom layer. The method further includes removing the protective layer from the second region and the bottom layer from the first region.

20 Claims, 9 Drawing Sheets

1200

Forming a bottom layer on a first region.
1202

The bottom layer includes an organic planarization layer (OPL).
1204

Forming a masking layer on the first region.
1210

Implanting a second region.
1220

Depositing a protective layer over the first region and the second region, with the protective layer being selectively etchable with the masking layer and thicker over the second region.
1230

Depositing the protective layer with an anisotropic atomic layer deposition (ALD) process.
1232

Depositing more of the protective layer on the second region than on the first region, with the thickness of the protective layer on the second region being equal to a combined thickness of the protective layer and the masking layer on the first region.
1234

Removing the masking layer and the protective layer exposing the second region.
1240

Removing a bottom layer to expose the first region.
1250

Forming a bottom layer on a first region.
1302

Forming a masking layer on the first region.
1310

Implanting a second region.
1320

Depositing a protective layer over the first region and the second region, to the protective layer being selectively etchable with the masking layer and thicker over the second region.
1330

*Depositing the protective layer with an anisotropic atomic layer deposition (ALD) process.*
  1332

*Depositing more of the protective layer on the second region than on the first region.*
  1334

Removing the protective layer from the first region.
1340

Etching the masking layer exposing a bottom layer.
1350

Removing the protective layer from the second region and the bottom layer from the first region.
1360

FIG. 13

DAMAGE FREE HARDMASK STRIP

BACKGROUND

Technical Field

The present invention generally relates to semiconductor processing, and more particularly to methods that can remove a hardmask without damaging an implanted region.

Description of the Related Art

Semiconductor patterning often employs masks for processing semiconductor structures. In some instances, multiple masking layers are employed to process different areas of a chip or wafer using different portions of a multilayered structure. In one example, patterning schemes with masks can be employed to protect underlying regions when another region is being implanted, etc. The removal of masking layers can damage the areas not protected by the masking layers. In the above example, the removal of the patterning mask can damage the implanted region, which is unprotected while the patterning mask is being removed.

SUMMARY

In accordance with an embodiment of the present invention, a method for semiconductor processing includes forming a masking layer on a first region. The method also includes implanting a second region. The method further includes depositing a protective layer over the first region and the second region, with the protective layer being selectively etchable with the masking layer and thicker over the second region. The method additionally includes removing the masking layer and the protective layer exposing the second region.

In accordance with another embodiment of the present invention, a method for semiconductor processing includes forming a masking layer on a first region. The method also includes implanting a second region. The method further includes depositing a protective layer over the first region and the second region, with the protective layer being selectively etchable to the masking layer and thicker over the second region. The method additionally includes removing the protective layer from the first region. The method also includes etching the masking layer exposing a bottom layer. The method further includes removing the protective layer from the second region and the bottom layer from the first region.

In accordance with yet another embodiment of the present invention, a method for semiconductor processing includes forming a bottom layer on a first region. The method further includes forming a TiOx layer on the first region. The method also includes ion implanting a second region with Ga. The method further includes depositing a protective layer, with an anisotropic atomic layer deposition, over the first region and the second region, with the protective layer being selectively etchable to the TiOx layer and thicker over the second region. The method additionally includes removing the protective layer from the first region. The method also includes removing the TiOx layer exposing a bottom layer. The method further includes removing the protective layer from the second region and the bottom layer from the first region These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 12 is a block/flow diagram showing a method for forming a semiconductor device in accordance with embodiments of the present invention;

FIG. 13 is a block/flow diagram showing a method for forming a semiconductor device in accordance with embodiments of the present invention.

DETAILED DESCRIPTION

Figure 1:
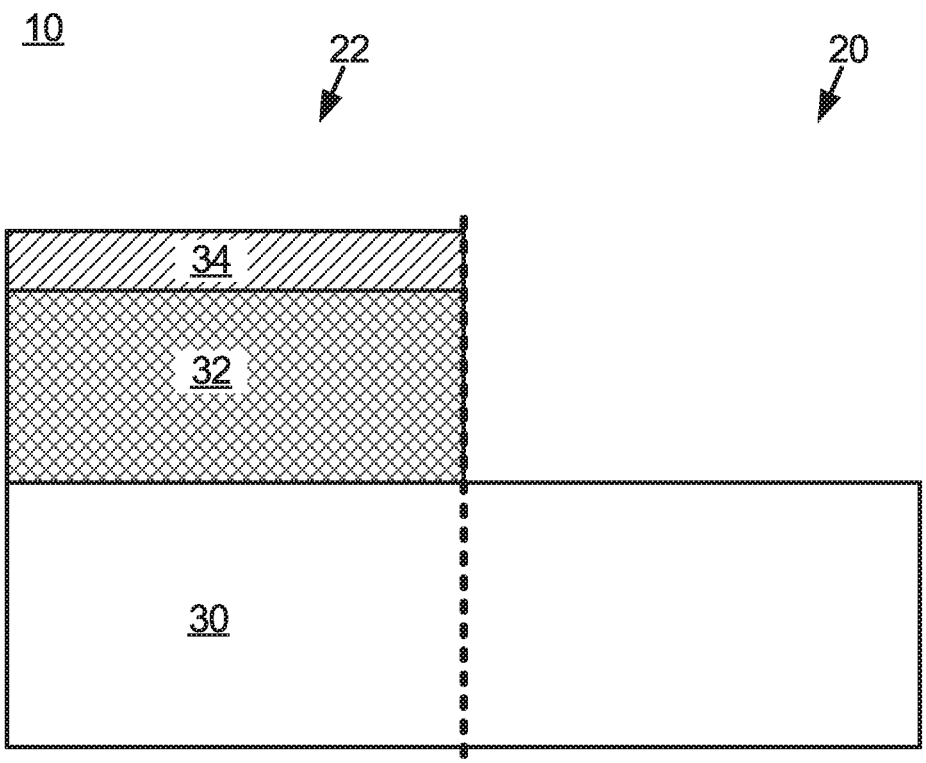
FIG. 1 is a cross-sectional view illustratively showing a semiconductor device with two regions where one region has a bottom layer and a masking layer, in accordance with an embodiment of the present invention.

In accordance with aspects of the present invention, protective structures and processing methods are provided for processing semiconductor devices. In particularly useful embodiments, the processing methods can be employed in complementary metal oxide semiconductor (CMOS) device processing, especially where different areas of the CMOS device are block implanted with different materials. The different areas being protected and implanted can vary in size. In one example, the protective structures and processing methods can be employed with about 50-1000 nanometer (nm) pitch with line/space pattern density ranging from about 1:1 to 1:10.

The stripping of implant patterning hardmasks (HM) (e.g., Si-containing anti-reflective coating material (SiARC)/low temperature oxide (LTO)/titanium oxide (TiOx)/titanium nitride (TiN)) can be challenging while protecting the substrate in many block implant patterning schemes, e.g., for contact resistance (RhO—C) reduction with Ga implantation. A very thick (e.g., >20 nm) patterning HM's can be needed to prevent the implant from entering an organic planarization layer (OPL). A protective layer can be applied over the implanted region to protect the implanted region during the HM strip. The protective layer can be formed with an anisotropic atomic layer deposition (ALD) process. The anisotropic ALD process can deposit a thicker layer on the bottom versus top/sidewalls, leaving more material to protect the implanted region. The anisotropic ALD process can form a conformal protective layer over the implant HM that is thicker on the implanted region.

In one embodiment, the protective layer can be amorphous carbon (aC) or other ashable compositions. The protective layer on the implant HM can be etched to reveal the implant HM, while still leaving a portion of the protective layer over the implanted region. The implant HM can be removed with dry or aggressive wet patterning strips, e.g., Standard Clean 1 (SC1) solution. The SC1 solution can include hydrogen peroxide ($H_2O_2$), Ammonium Hydroxide ($NH_4OH$) and water ($H_2O$). The SC1 solution can include a ratio of $H_2O_2$ to $NH_4OH$ of about 4:1, however, various relative concentrations of $H_2O_2$ and $NH_4OH$ can also be used in various formulations in cleaning operations.

The OPL and the protective layer can be removed in a single etch (e.g., by reactive ion etching (RIE)) that does not harm the substrate, leaving the implanted region and a non-implanted region unharmed.

In another embodiment, the protective layer can be the same or similar material as the implant HM, including silicon based materials (e.g., SiN, SiON, SiOC, SiC), metal hardmasks (e.g., TiOx, TiN), and any other transition metal oxides (HfOx, ZnOx, ZrOx, TiOxNy). The anisotropic ALD process will deposit more material at the bottom, on the implanted region, than on the top, on the implant HM. The anisotropic ALD process will deposit enough material so that the thickness on the protective layer on the bottom is equal to the thickness of the combined implant HM and protective layer on the top. This varied deposition thickness of the protective layer permits a single etch to remove both the implant HM and the protective layer. The protective layer and the implant HM can be removed with an aggressive wet patterning strip, e.g., SC1, to reveal the OPL and the implant region without damaging either. In this example, the protective layer is removed from both regions. The protective layer will be completely removed from the region with the implant HM before the protective layer is completely removed from the implanted region. The stripping will continue to remove the protective layer covering the implanted region while now removing the implant HM. The thicknesses of the protective layer and the implant HM will be the same thickness once the implant HM starts being stripped. The stripping will end once the protective layer and the implant HM are removed, and neither region will have a layer below the protective layer or implant HM exposed to the strip since both the protective layer and the implant HM will be removed contemporaneously. The OPL and the implanted region will be exposed after the protective layer and the implant HM strip. The OPL can be removed in an etch that does not harm the substrate, leaving an implanted region and a non-implanted region unharmed.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not, preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or features) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer referred to as being "between" two layers, it can be the only, layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, in accordance with one embodiment, a semiconductor device 10 is illustratively shown. The device 10 can include a CMOS device. The device 10 includes a substrate 30. The substrate 30 can include any structures formed therein. The device 10 includes a first region 20 and a second region 22. In one embodiment, the first region 20 can be an NFET region and the second region 22 can be a PFET region. In another embodiment, the first region 20 can be a PFET region and the second region 22 can be a NFET region. In yet another embodiment, both the first region 20 and the second region 22 can be PFET regions or NFET regions. The second region 22 includes a bottom layer 32 and a masking layer 34. The substrate 30 can have the bottom layer 32 formed thereon. In one embodiment, the bottom layer 32 includes an organic planarization layer (OPL). In another embodiment, the bottom layer 32 can include a spun-on organic layer such as, for example, a Near Frictionless Carbon (NFC), a diamond-like carbon, a thermosetting polyarylene ether or polyimide.

The masking layer 34 can include any oxide layer such as, for example, a low temperature (e.g., less than or equal to 250° C.) chemical vapor deposited (CVD) oxide, an oxide derived from TEOS (tetraethylorthosilicate), a silicon oxide, $TiO_x$, TiN, and other transition metal oxide ($HfO_x$, $ZnO_x$, $ZrO_x$, $TiO_xN_y$), etc. In one embodiment, the masking layer 34 is selectively etchable to the bottom layer 32. The phrase "selectively etchable to" means that a particular etchant which attacks one of the materials will not attack the other material as quickly, allowing for controlled removal of each material. The masking layer 34 should be thick enough to stop the implantation of impurities into the bottom layer 32 in a subsequent step. In one embodiment, the masking layer is greater than 20 nanometers (nm) thick.

Figure 2:
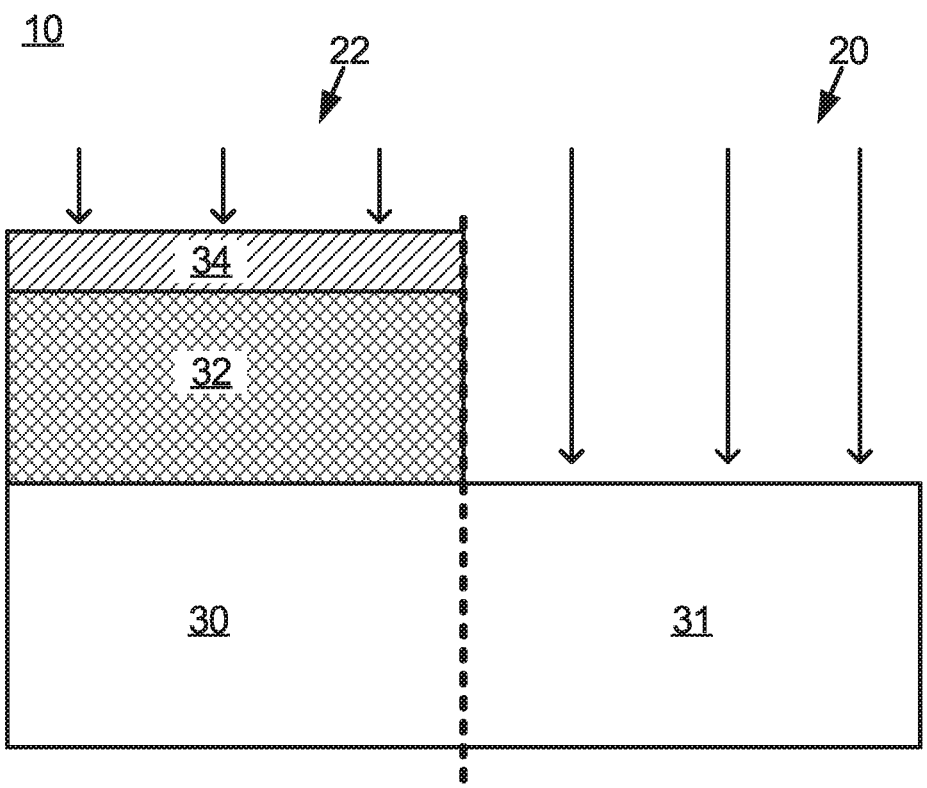
FIG. 2 is a cross-sectional view of the device of FIG. 1 showing a region being implanted, in accordance with an embodiment of the present invention.

Referring to FIG. 2, an implantation is performed on the device 10. The implantation can include an ion implantation. The implantation can implant any useful material into the device 10. In one embodiment, the implantation implants gallium, phosphorus, or boron. The implantation creates an implanted substrate 31. In the illustrative example depicted, the substrate 30 in the second region 22 is protected from implantation by the masking layer 34 and the bottom layer 32, while the implanted substrate 31 is formed in the first region 20.

Figure 3:
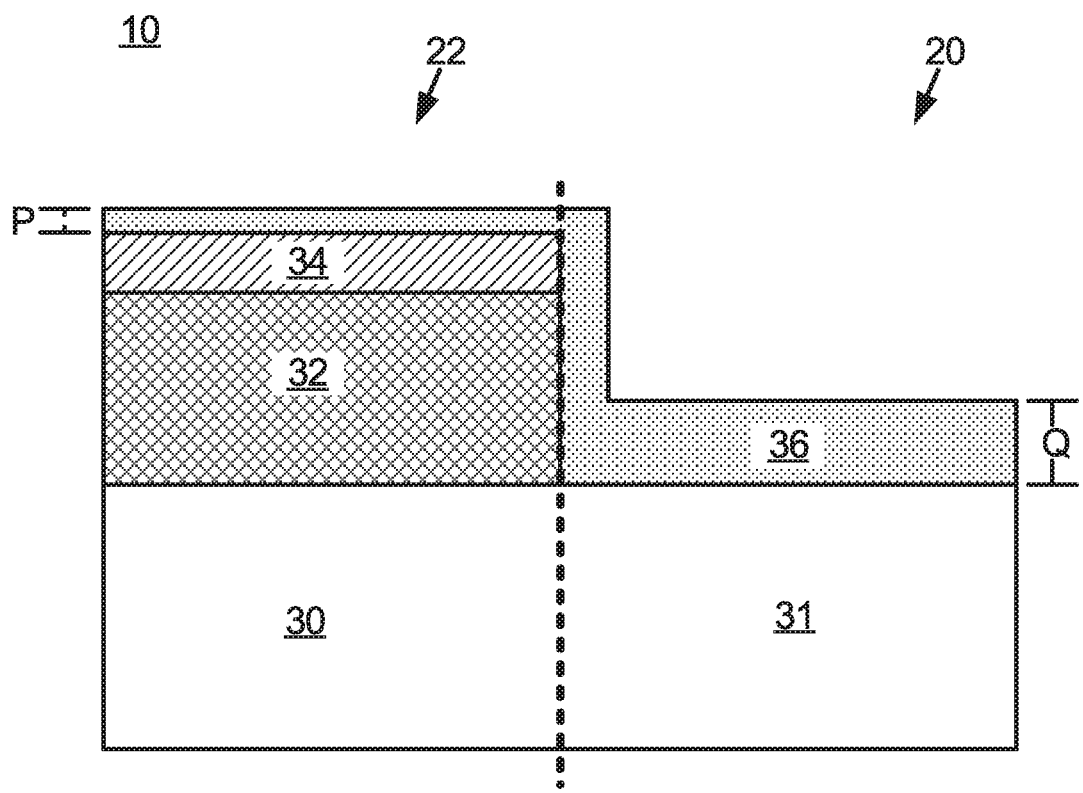
FIG. 3 is a cross-sectional view of the device of FIG. 2 showing a protective layer formed on the semiconductor device, in accordance with an embodiment of the present invention.

Referring to FIG. 3, a protective layer 36 is formed on the device 10. The protective layer 36 is selectively etchable to the masking layer 32. In one embodiment, the protective layer 36 can be amorphous carbon (aC) or other ashable compositions. The protective layer 36 can be formed with an anisotropic atomic layer deposition (ALD) process. The anisotropic ALD process can form a conformal protective layer 36 over the device 10 that is thicker on the bottom. The anisotropic ALD process can deposit a thicker layer on the implanted substrate 31 versus the masking layer 34. In the illustrative example depicted, the protective layer 36 has a thickness of Q in the first region 20 over the implanted substrate 31 and a thickness of P over the masking layer 32 in the second region 22, with Q>P.

Figure 4:
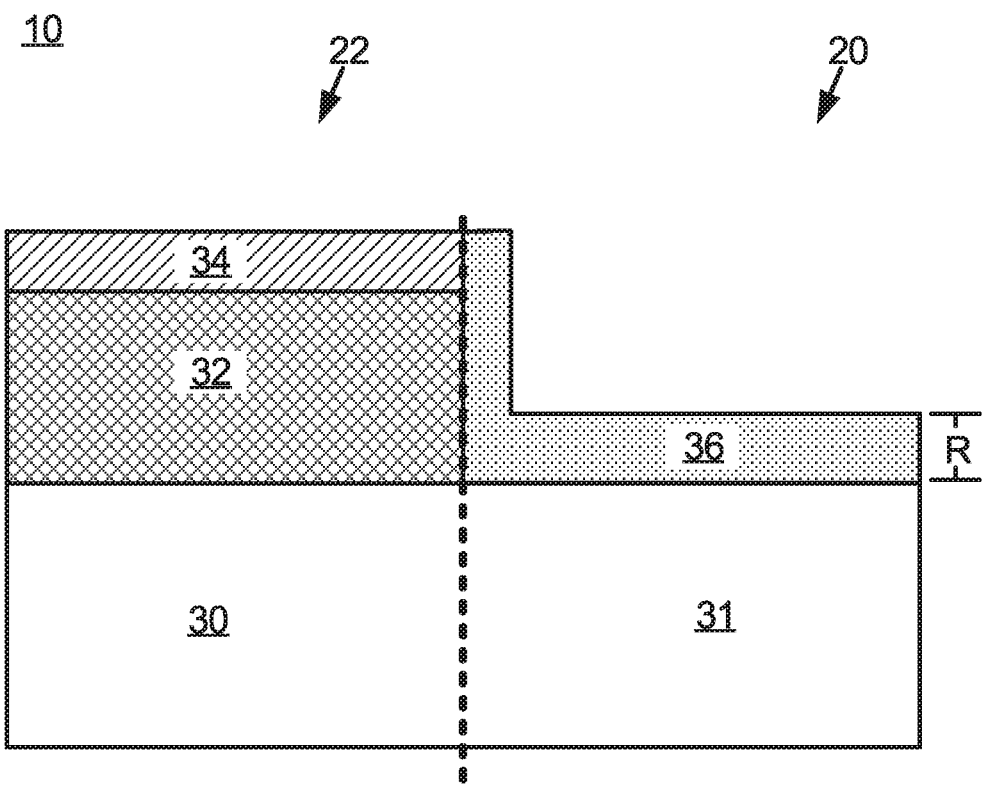
FIG. 4 is a cross-sectional view of the device of FIG. 3 showing the protective layer etched back to reveal the masking layer, in accordance with an embodiment of the present invention.

Referring to FIG. 4, the protective layer 36 can be etched back to reveal the masking layer 34. Any suitable etch process may be employed that is selective to the protective layer 36 and leaves the masking layer 34 intact. In one embodiment, the protective layer 36 is etched back with a RIE. The etch back reveals the masking layer 34 but leaves the protective layer 36 over the implanted substrate 31. The thickness of the protective layer 36 over the implanted substrate 31 can go from Q to R, with Q>R. In one embodiment, R=Q−P. This reduction in the thickness of the protective layer 36 should leave enough thickness to protect the implanted substrate 31 in a subsequent step.

Figure 5:
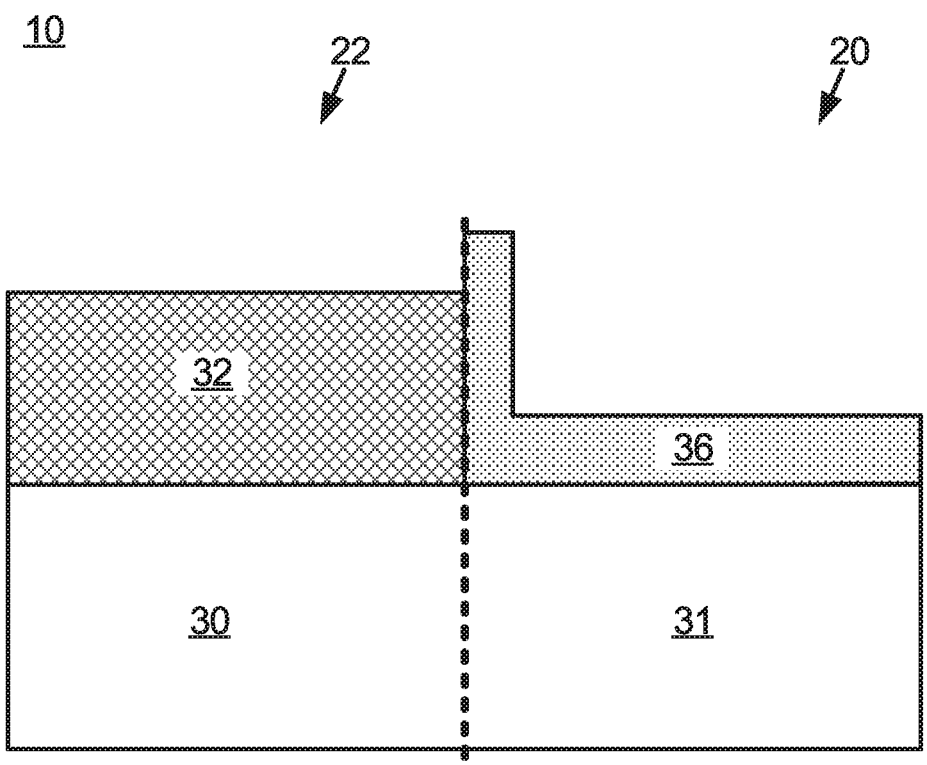
FIG. 5 is a cross-sectional view of the device of FIG. 4 showing the masking layer removed from the semiconductor device, in accordance with an embodiment of the present invention.

Referring to FIG. 5, the masking layer 34 is removed. Any suitable etch process may be employed that is selective to the masking layer 36 and leaves the protective layer 34 and the bottom layer 32 intact. In one embodiment, the masking layer 34 is removed with a SC1 solution.

Figure 6:
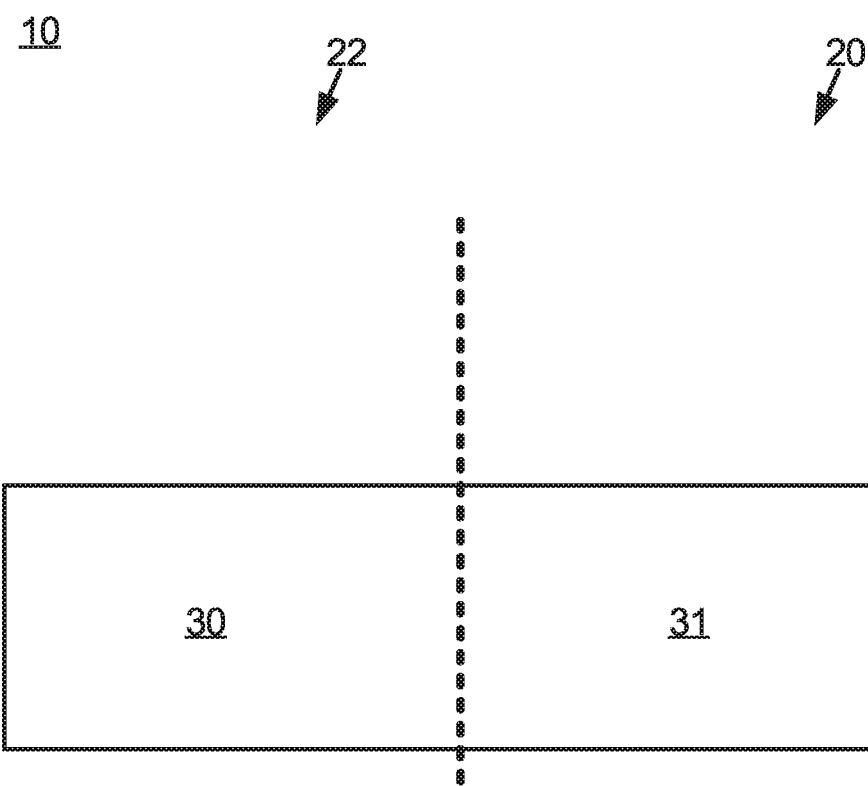
FIG. 6 is a cross-sectional view of the device of FIG. 5 showing the bottom layer and the protective layer removed from the semiconductor device, in accordance with an embodiment of the present invention.

Referring to FIG. 6, the protective layer 36 and the bottom layer 32 are removed. In one embodiment, the protective layer 36 and the bottom layer 32 can be removed with a single etch. The protective layer 36 can be removed with an etch that is selective to the protective layer 36. The bottom layer 32 can be removed with an etch that is selective to the bottom layer 32. In another embodiment, the protective layer 36 and the bottom layer 32 can be removed with etches selective to the respective materials in any order. In yet another embodiment, the protective layer 36 and the bottom layer 32 are removed with a single RIE. The removal of the bottom layer 32 and the protective layer 36 exposes the implanted substrate 31 in the first region 20 and the substrate 30 in the second region 22.

Figure 7:
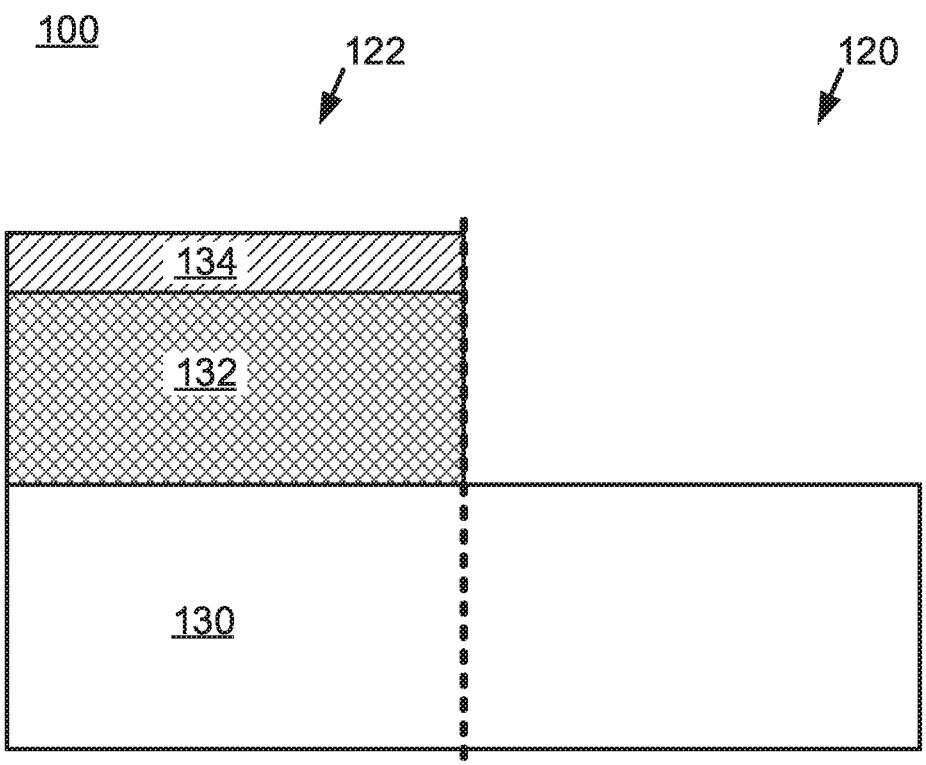
FIG. 7 is a cross-sectional view illustratively showing a semiconductor device with two regions where one region has a bottom layer and a masking layer, in accordance with an embodiment of the present invention.

FIG. 7, in accordance with another embodiment, a semiconductor device 100 is illustratively shown. The device 100 can include a CMOS device. The device 100 includes a substrate 130. The substrate 130 can include any structures formed therein. The device 100 includes a first region 120 and a second region 122. The second region 122 includes a bottom layer 132 and a masking layer 134. In one embodiment, the first region 120 can be an NFET region and the second region 122 can be a PFET region. In another embodiment, the first region 120 can be a PFET region and the second region 122 can be a NFET region. In yet another embodiment, both the first region 120 and the second region 122 can be PFET regions or NFET regions. The substrate 130 can have the bottom layer 132 formed thereon. In one embodiment, the bottom layer 132 includes an organic planarization layer (OPL). In another embodiment, the bottom layer 132 can include a spun-on organic layer such as, for example, a Near Frictionless Carbon (NFC), a diamond-like carbon, a thermosetting polyarylene ether or polyimide.

The masking layer 134 can include any oxide layer such as, for example, a low temperature (e.g., less than or equal to 250° C.) chemical vapor deposited (CVD) oxide, an oxide derived from TEOS (tetraethylorthosilicate), a silicon oxide, TiOx, TiN, and other transition metal oxide (HfOx, ZnOx, ZrOx, TiOxNy), etc. In one embodiment, the masking layer 134 is selectively etchable to the bottom layer 132. Selectively etchable to means that a particular etchant which attacks one of the materials will not attack the other material as quickly, allowing for controlled removal of each material. The masking layer 134 should be thick enough to stop the implantation of impurities into the bottom layer 132 in a subsequent step. In one embodiment, the masking layer is greater than 20 nanometers (nm) thick.

Figure 8:
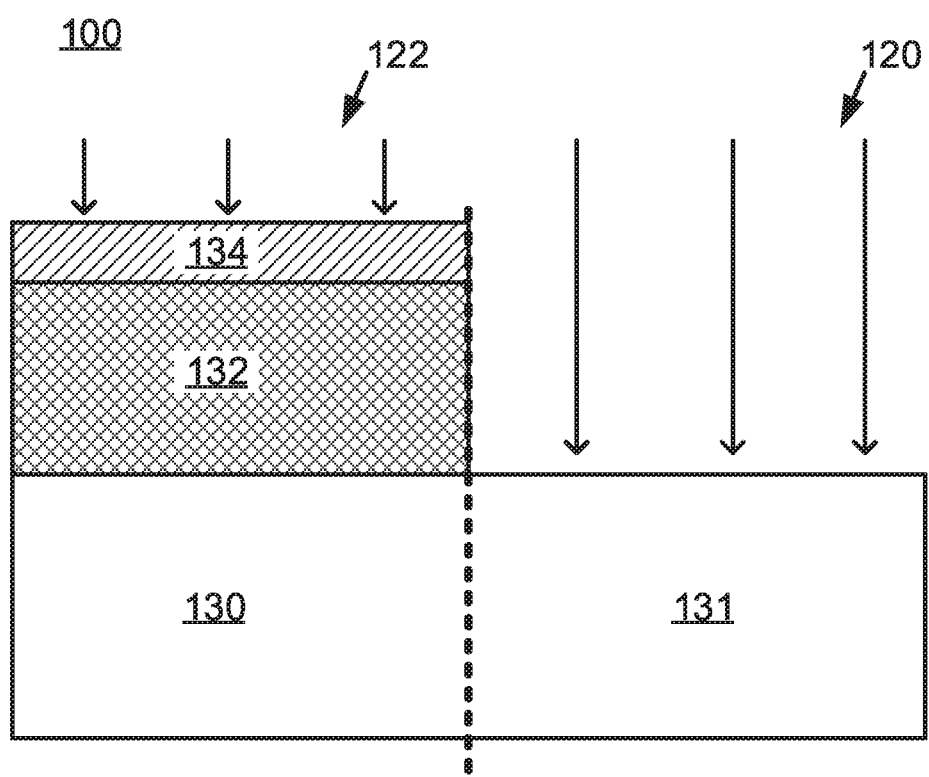
FIG. 8 is a cross-sectional view of the device of FIG. 7 showing a region being implanted, in accordance with an embodiment of the present invention.

Referring to FIG. 8, an implantation is performed on the device 100. The implantation can include an ion implantation. The implantation can implant any useful material into the device 100. In one embodiment, the implantation implants gallium, phosphorus, or boron. The implantation creates an implanted substrate 131. In the illustrative example depicted, the substrate 130 in the second region 122 is protected from implantation by the masking layer 134 and the bottom layer 132, while the implanted substrate 131 is created in the first region 120.

Figure 9:
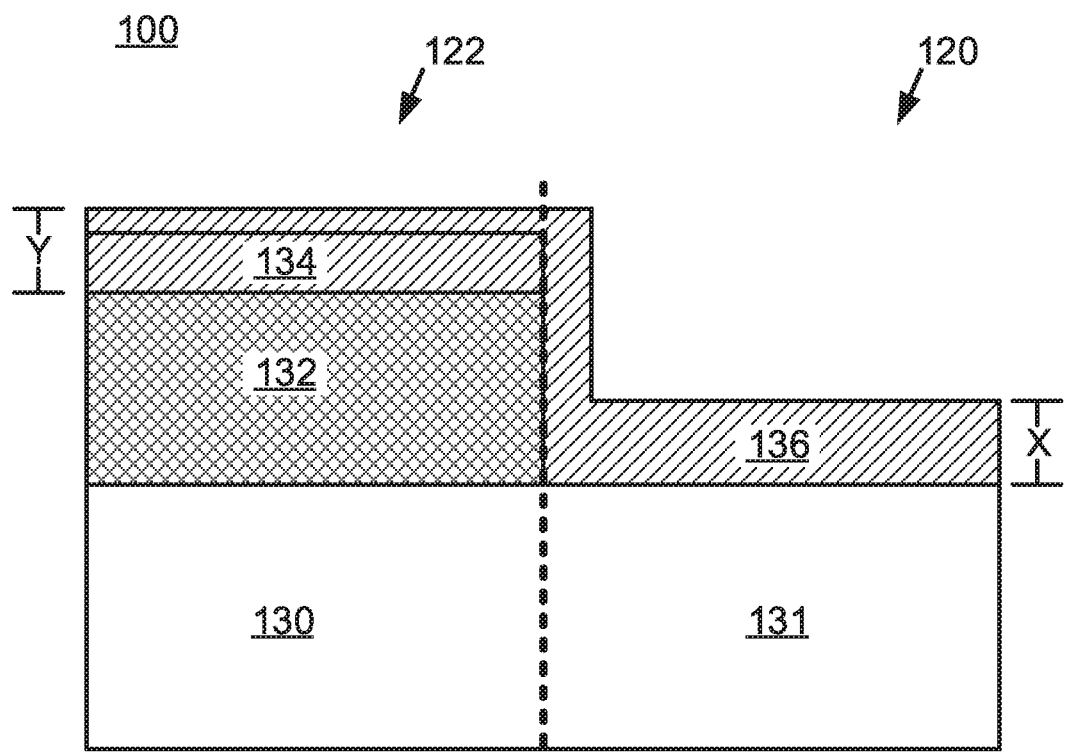
FIG. 9 is a cross-sectional view of the device of FIG. 8 showing a protective layer formed on the semiconductor device, in accordance with an embodiment of the present invention.

Referring to FIG. 9, a protective layer 136 is formed on the device 100. The protective layer 136 is selectively etchable with the masking layer 132 so that both the protective layer 136 and the masking layer 134 can be etched with the same etch process. Selectively etchable with means that a particular etchant which attacks one of the materials will attack the other materials at the same rate, allowing for controlled removal of both materials. In one embodiment, the protective layer 36 can be a low temperature (e.g., less than or equal to 250° C.) chemical vapor deposited (CVD) oxide, an oxide derived from TEOS (tetraethylorthosilicate), a silicon oxide, TiOx, TiN, and other transition metal oxide (HfOx, ZnOx, ZrOx, TiOxNy), etc. The protective layer 36 can be formed with an anisotropic atomic layer deposition (ALD) process. The anisotropic ALD process can form a conformal protective layer 136 over the device 100 that is thicker on the bottom. The anisotropic ALD process can deposit a thicker layer on the implanted substrate 31 versus the masking layer 34. The thickness, X, of the protective layer 136 in the first region 120 should be the same as the thickness, Y, of the masked layer 134 and the protective layer 136 combined in the second region 122, X=Y. The single thickness of the protective layer 136 and the masking layer 134 over the first region 120 and the second region 122 permits a single etch process to remove both layers from the device 100 without damaging the implanted substrate 131 in a subsequent step.

Figure 10:
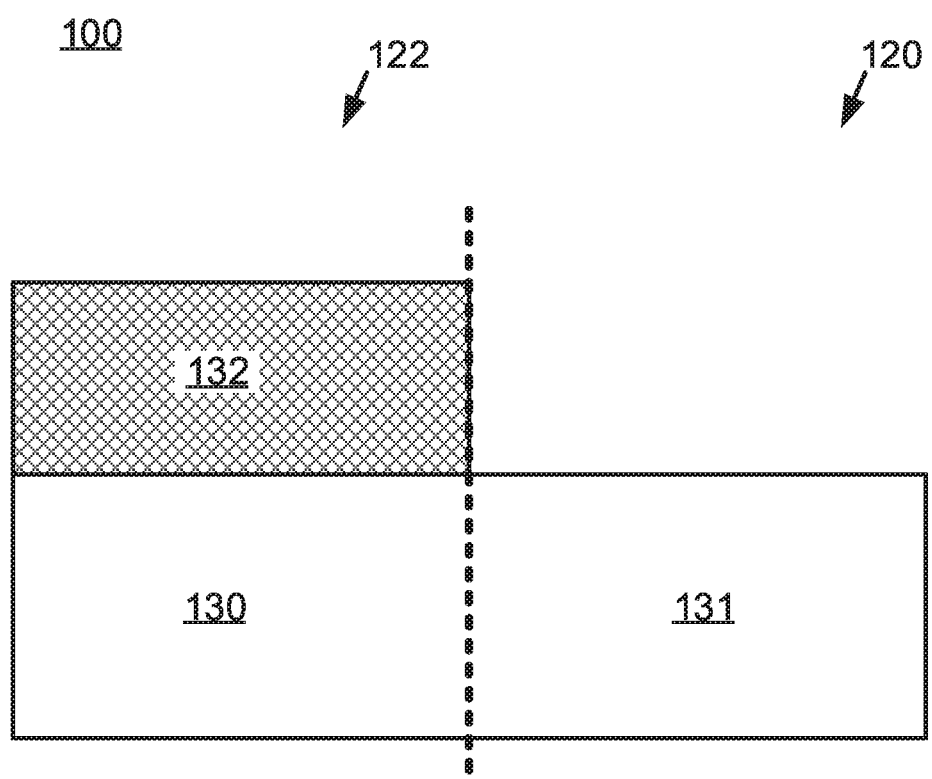
FIG. 10 is a cross-sectional view of the device of FIG. 9 showing the masking layer and the protective layer being removed from the semiconductor device, in accordance with an embodiment of the present invention.

Referring to FIG. 10, the masking layer 134 and the protective layer 136 are removed. Any suitable etch process may be employed that is selective to the material in both the masking layer 134 and the protective layer 136. In one embodiment, the masking layer 134 and the protective layer 136 are removed with a SC1 solution. In another embodiment, the masking layer 134 and the protective layer 136 are removed with a diluted hydrogen fluoride (DHF) solution or a buffered hydrogen fluoride (BHF) solution. DHF can be a mixture of HF and $H_2O$, in which $H_2O$:HF is 200:1 and wherein the HF is 49% in $H_2O$. BHF can a mixture of $NH_4F$, HF and $H_2O$, in which the $NH_4F$:HF is 40:1 and wherein the HF is 49% in $H_2O$. The removal of the masking layer 134 and the protective layer 136 exposes the implanted substrate 31 in the first region 20 and the bottom layer 132 in the second region 22.

Figure 11:
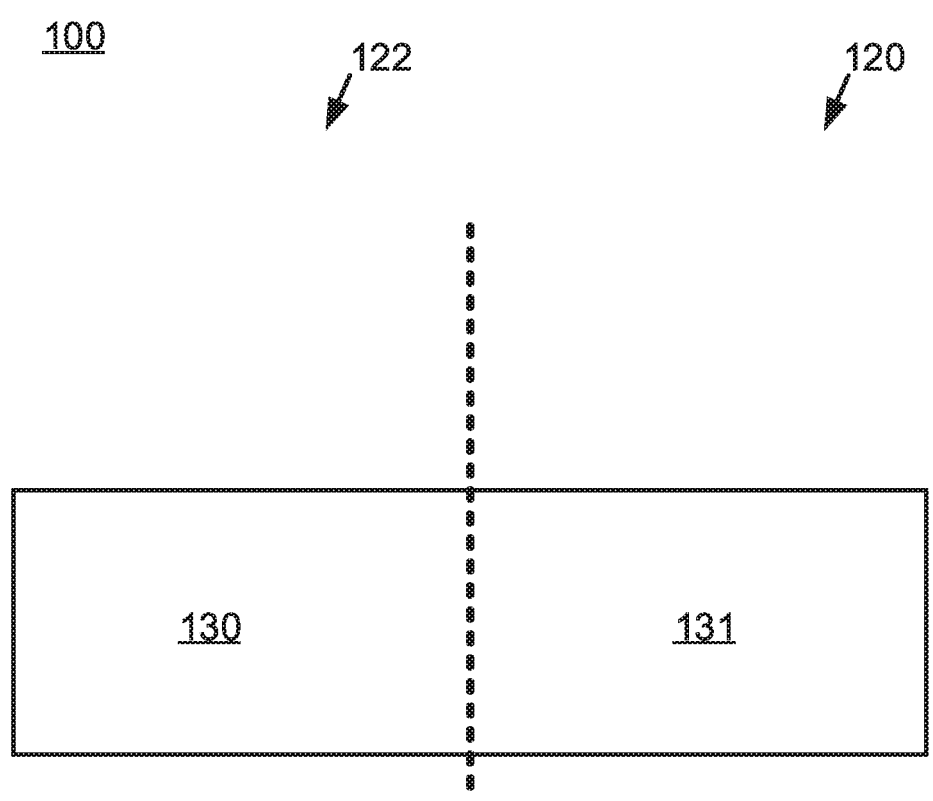
FIG. 11 is a cross-sectional view of the device of FIG. 10 showing the bottom layer removed from the semiconductor device, in accordance with an embodiment of the present invention.

Referring to FIG. 11, the bottom layer 132 is removed. The bottom layer 132 can be removed with an etch that is selective to the bottom layer 132. In one embodiment, the bottom layer 132 is removed with a RIE. The removal of the bottom layer 132 exposes the substrate 130 in the second region 122.

Referring to FIG. 12, methods for semiconductor processing are illustratively shown and described. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 1202, a bottom layer is formed on the first region. In block 1204, the bottom layer includes an organic planarization layer (OPL). In block 1210, a masking layer is formed on the first region. In block 1220, a second region is implanted. In block 1230, a protective layer is deposited over the first region and the second region, with the protective layer being selectively etchable with the masking layer and thicker over the second region. In block 1234, the protective layer is deposited with an anisotropic atomic layer deposition (ALD) process. In block 1234, more of the protective layer is deposited on the second region than on the first region, with the thickness of the protective layer on the second region being equal to a combined thickness of the protective layer and the masking layer on the first region. In block 1240, the masking layer and the protective layer are removed exposing the second region. In block 1250, a bottom layer is removed to expose the first region.

Referring to FIG. 13, methods for semiconductor processing are illustratively shown and described. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 1302, a bottom layer is formed on a first region. In block 1304, the bottom layer includes an organic planarization layer (OPL). In block 1310, a masking layer is formed on a first region. In block 1320, a second region is implanted. In block 1330, a protective layer is deposited over the first region and the second region, with the protective layer being selectively etchable to the masking layer and thicker over the second region. In block 1332, the protective layer is deposited with an anisotropic atomic layer deposition (ALD) process. In block 1334, more of the protective layer is deposited on the second region than on the first region. In block 1340, the protective layer is removed from the first region. In block 1350, the masking layer is etched exposing a bottom layer. In block 1360, the protective layer is removed from the second region and the bottom layer is removed from the first region.

Figure 14:
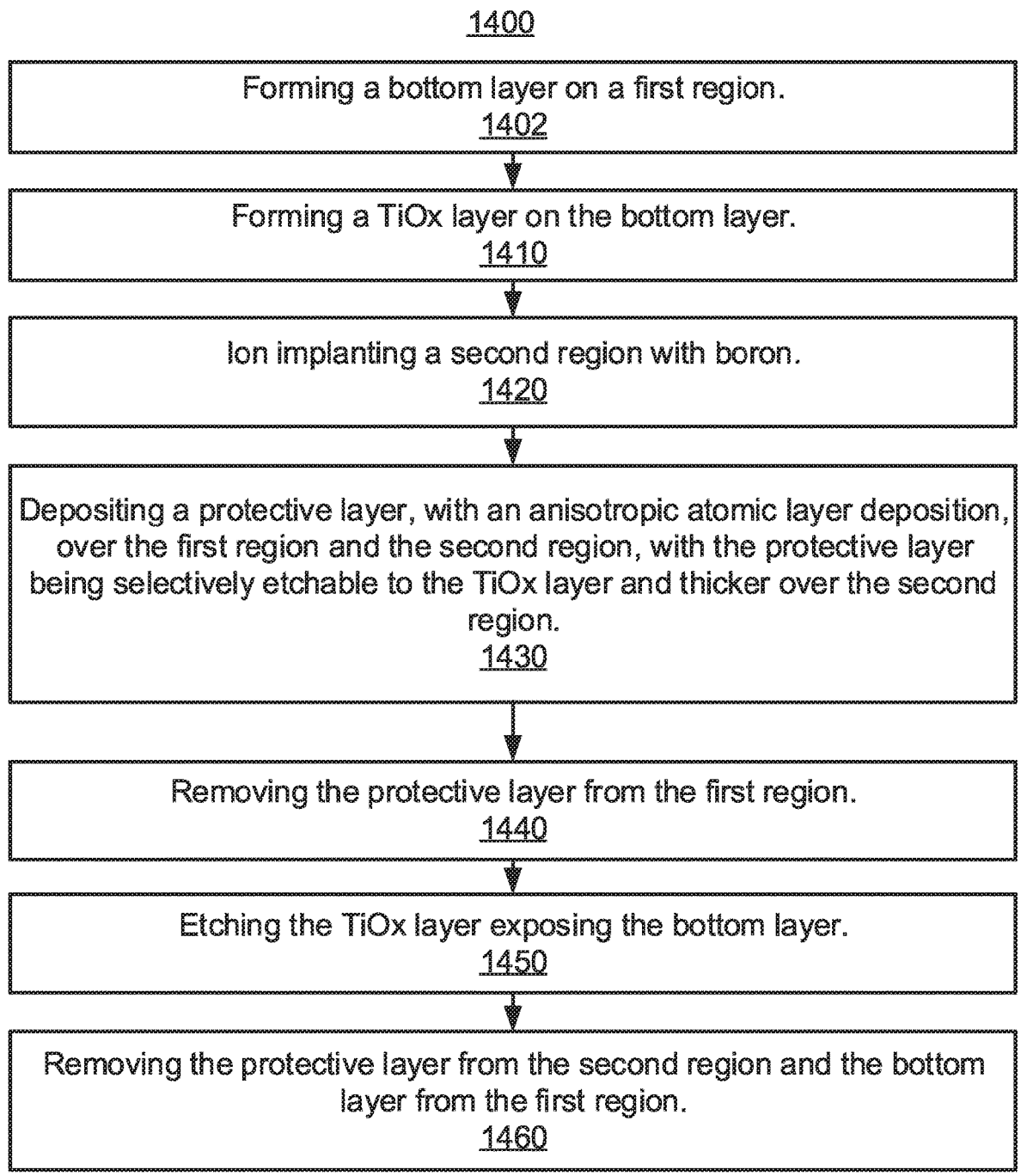
FIG. 14 is a block/flow diagram showing a method for forming a semiconductor device in accordance with embodiments of the present invention.

Referring to FIG. 14, methods for semiconductor processing are illustratively shown and described. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 1402, a bottom layer is formed on a first region. In block 1410, a TiOx layer is formed on the bottom layer. In block 1420, a second region is ion implanted with Ga. In block 1430, a protective layer is deposited, with an anisotropic atomic layer deposition, over the first region and the second region, with the protective layer being selectively etchable to the TiOx layer and thicker over the second region. In block 1440, the protective layer is removed from the first region. In block 1450, the TiOx layer is removed exposing the bottom layer. In block 1460, the protective layer is removed from the second region and the bottom layer is removed from the first region.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for semiconductor processing, comprising:
 forming a masking layer on a first region;
 implanting a second region;
 depositing a protective layer over the first region and the second region, with the protective layer being selectively etchable with the masking layer and thicker over the second region;
 removing the masking layer and the protective layer exposing the second region; and
 removing a bottom layer having an organic planarization layer (OPL) to expose the first region.

2. The method as recited in claim 1, further comprises forming a bottom layer on the first region, with the bottom layer being between the masking layer and a substrate.

3. The method as recited in claim 1, wherein depositing includes depositing more of the protective layer on the second region than on the first region, with the thickness of the protective layer on the second region being equal to a combined thickness of the protective layer and the masking layer on the first region.

4. The method as recited in claim 1, wherein removing includes utilizing a standard clean 1 (SC1) solution.

5. The method as recited in claim 1, wherein the masking layer is selected from the group consisting of a low temperature oxide (LTO), a titanium oxide (TiOx), a silicon oxide, a titanium nitride (TiN), and other transition metal oxides (HfOx, ZnOx, ZrOx, TiOxNy).

6. The method as recited in claim 1, wherein the protective layer is selected from the group consisting of a LTO, a TiOx, a silicon oxide, a TiN, and other transition metal oxides.

7. The method as recited in claim 1, wherein implanting includes utilizing ion implantation to implant an impurity selected from the group consisting of Gallium, Phosphorus, and Boron.

8. A method for semiconductor processing, comprising:
 forming a masking layer on a first region;
 implanting a second region;
 depositing a protective layer over the first region and the second region, with the protective layer being selectively etchable to the masking layer and thicker over the second region;
 removing the protective layer from the first region;
 etching the masking layer exposing a bottom layer; and
 removing the protective layer from the second region and the bottom layer from the first region after removing the protective layer from the first region and etching the masking layer.

9. The method as recited in claim 8, wherein the bottom layer includes an organic planarization layer (OPL).

10. The method as recited in claim 8, further comprises forming a bottom layer on the first region, with the bottom layer being between the masking layer and a substrate.

11. The method as recited in claim 8, wherein depositing includes depositing the protective layer with an anisotropic atomic layer deposition (ALD) process.

12. The method as recited in claim 11, wherein depositing includes depositing more of the protective layer on the second region than on the first region.

13. The method as recited in claim 8, wherein etching includes utilizing a standard clean 1 (SC1) solution.

14. The method as recited in claim 8, wherein the masking layer is selected from the group consisting of a low temperature oxide (LTO), a titanium oxide (TiOx), a silicon oxide, a titanium nitride (TiN), and other transition metal oxides (HfOx, ZnOx, ZrOx, TiOxNy).

15. The method as recited in claim 8, wherein the protective layer is OPL.

16. The method as recited in claim 8, wherein implanting includes utilizing ion implantation to implant an impurity selected from the group consisting of gallium, phosphorus, and boron.

17. A method for semiconductor processing, comprising:
forming a masking layer on a first region;
implanting a second region;
depositing a protective layer with an anisotropic atomic layer deposition (ALD) process over the first region and the second region, with the protective layer being selectively etchable with the masking layer and thicker over the second region; and
removing the masking layer and the protective layer exposing the second region.

18. The method as recited in claim 17, further comprising forming a bottom layer on the first region, with the bottom layer being between the masking layer and a substrate.

19. The method as recited in claim 17, wherein depositing includes depositing more of the protective layer on the second region than on the first region, with the thickness of the protective layer on the second region being equal to a combined thickness of the protective layer and the masking layer on the first region.

20. The method as recited in claim 17, wherein the protective layer is deposited conformally over the first region and the second region.

* * * * *